(12) United States Patent
Syue et al.

(10) Patent No.: US 7,947,551 B1
(45) Date of Patent: May 24, 2011

(54) METHOD OF FORMING A SHALLOW TRENCH ISOLATION STRUCTURE

(75) Inventors: Sen-Hong Syue, Hsinchu (TW); Bor Chiuan Hsieh, Taoyuan (TW); Shiang-Bau Wang, Pingzchen (TW)

(73) Assignee: Taiwan Semiconductor Manufacturing Company, Ltd.

( * ) Notice: Subject to any disclaimer, the term of this patent is extended or adjusted under 35 U.S.C. 154(b) by 0 days.

(21) Appl. No.: 12/892,331

(22) Filed: Sep. 28, 2010

(51) Int. Cl.
*H01L 21/00* (2006.01)

(52) U.S. Cl. ......... 438/218; 438/196; 438/207; 257/374

(58) Field of Classification Search .......... 438/207, 438/196, 218; 257/374
See application file for complete search history.

(56) References Cited

U.S. PATENT DOCUMENTS

| | | | |
|---|---|---|---|
| 5,869,384 A * | 2/1999 | Yu et al. | 438/431 |
| 6,004,847 A * | 12/1999 | Clementi et al. | 438/258 |
| 6,008,108 A * | 12/1999 | Huang et al. | 438/436 |
| 7,026,256 B2 | 4/2006 | Sohn | |
| 7,112,513 B2 * | 9/2006 | Smythe et al. | 438/431 |
| 7,176,105 B2 | 2/2007 | Nemani | |
| 7,442,621 B2 * | 10/2008 | Orlowski et al. | 438/436 |
| 7,541,297 B2 * | 6/2009 | Mallick et al. | 438/778 |
| 2007/0031598 A1 * | 2/2007 | Okuyama et al. | 427/248.1 |
| 2009/0243050 A1 * | 10/2009 | Eun | 257/647 |

* cited by examiner

*Primary Examiner* — Jarrett J Stark
*Assistant Examiner* — Nicholas Tobergte
(74) *Attorney, Agent, or Firm* — Lowe Hauptman Ham & Berner, LLP

(57) ABSTRACT

An embodiment of the disclosure includes a method of forming a shallow trench isolation structure. A substrate is provided. The substrate includes a top surface. A trench is formed to extend from the top surface into the substrate. The trench has sidewalls and a bottom surface. A silicon liner layer is formed on the sidewalls and the bottom surface. A flowable dielectric material is filled in the trench. An anneal process is performed to densify the flowable dielectric material and convert the silicon liner layer into a silicon oxide layer simultaneously.

20 Claims, 4 Drawing Sheets

METHOD OF FORMING A SHALLOW TRENCH ISOLATION STRUCTURE

TECHNICAL FIELD

The present invention relates generally to methods for manufacturing semiconductor devices, and more particularly to manufacturing methods for a shallow trench isolation structure.

BACKGROUND

Generally, shallow trench isolations (STIs) are used to separate and isolate active areas on a semiconductor wafer from each other. These STIs have historically been formed by etching trenches, overfilling the trenches with a dielectric such as an oxide, and then removing any excess dielectric with a process such as chemical mechanical polishing (CMP) or etching in order to remove the dielectric outside the trenches. This dielectric helps to electrically isolate the active areas from each other.

However, as circuit densities continue to increase, the widths of these gaps decrease, thereby increasing gap aspect ratios, which are typically defined as the gap height divided by the gap width. As a result, it is very difficult to fill these narrow and deep gaps with a predetermined gap-fill dielectric material, which can lead to unwanted voids and discontinuities in the gap-fill dielectric material. STIs fabricated by conventional methods may not provide adequate isolation. The electrical performance of a device with inadequate isolation will be impacted and reduces device yield.

BRIEF DESCRIPTION OF THE DRAWINGS

The disclosure will be described with reference to embodiments thereof as illustrated in the accompanying figures. It should be understood that the drawings are for illustrative purposes and are therefore not drawn to scale.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative of specific ways to make and use the invention, and do not limit the scope of the invention.

FIGS. 1-6 are perspective and cross-sectional views of an STI structure at various stages of manufacture. FIG. 7 depicts a flowchart of a method 200 for fabricating STI structures according to one embodiment of the disclosure.

Figure 1:
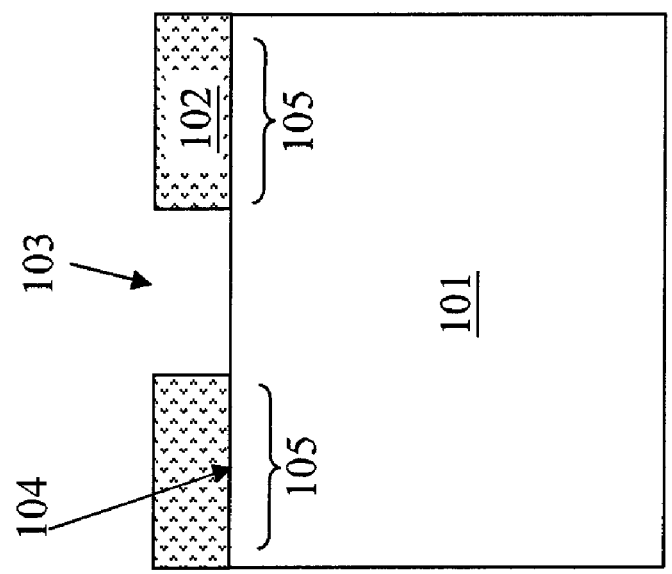

Referring to FIG. 1 and FIG. 7, in process step 200, a substrate 101 having a top surface 104 is provided. The substrate 101 may comprise bulk silicon, doped or undoped, or an active layer of a silicon on insulator (SOI) substrate. Generally, an SOI substrate comprises an active layer of a semiconductor material such as silicon, germanium, silicon germanium, silicon germanium on insulator (SGOI), or combinations thereof. Other substrates that may be used include multi-layered substrates, gradient substrates, or hybrid orientation substrates.

Next, a mask layer 102 is formed on the top surface 104 of the substrate 101 and exposes an opening 103 to define active areas 105 on the top surface 104. The active areas 105 are preferably electrically conductive regions of the substrate 101 adjacent to the top surface 104 of the substrate 101. The active areas 105 will preferably be used for components of active devices (such as transistors, resistors, etc.) to be formed later. The active areas 105 are preferably formed by the implantation of suitable materials into the crystal silicon substrate. Depending upon the materials chosen, the active areas 105 may comprise either an n-well or a p-well as preferably determined by the design requirements.

The masking layer 102 may be a hardmask comprising silicon nitride formed through a process such as chemical vapor deposition (CVD), although other materials, such as oxides, oxynitrides, silicon carbide, and combinations of these may alternatively be utilized. Other deposition processes, such as plasma enhanced chemical vapor deposition (PECVD), low pressure chemical vapor deposition (LPCVD), or silicon oxide formation followed by nitridation, may alternatively be utilized. Once formed, the masking layer 102 is patterned through suitable photolithographic and etching processes to form the opening 103 and expose those portions of the substrate 101.

Figure 2:
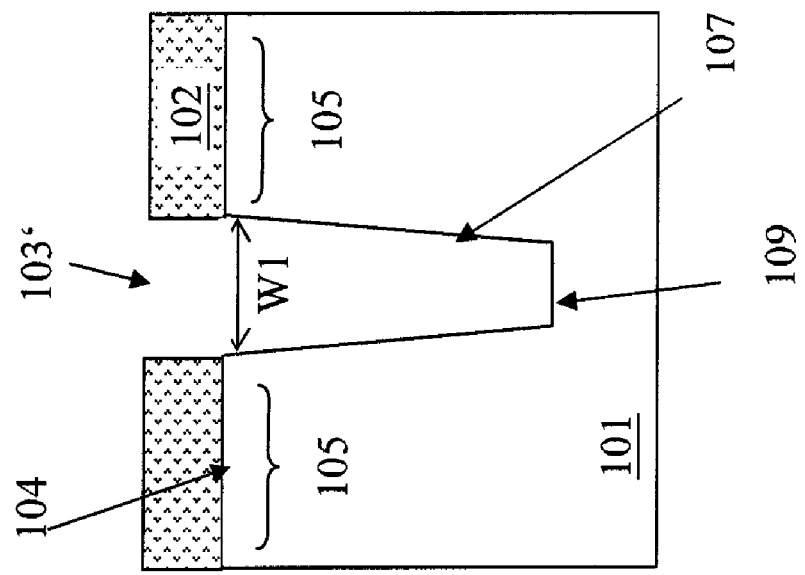
FIGS. 1-6 show a cross-sectional view of a shallow trench isolation structure at various fabrication stages according to embodiments of this disclosure.

Referring to FIG. 2 and FIG. 7, in process step 210, a trench 103' is formed so that it extends from the top surface 104 into the substrate 101. The exposed portions of the substrate 101 through the opening 103 are removed by a suitable process such as reactive ion etching (RIE) in order to form the trench 103' in the substrate 101. The trench 103' separates active areas 105 on the top surface 104 of the substrate 101. The trench 103' comprises sidewalls 107 and a bottom surface 109. In one embodiment, the trench 103' has a width W1 that is not more than 42 nm. An aspect ratio, the trench depth divided by the trench width W1, of the trench 103' is in the range of about 5 to about 10.

Figure 3:
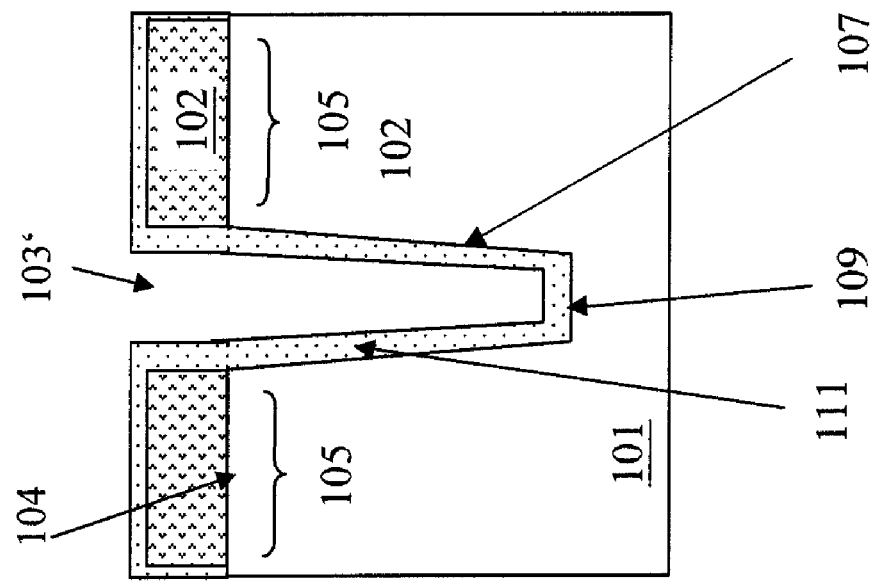

Referring to FIG. 3 and FIG. 7, in process step 220, a silicon liner layer 111 is then formed on the sidewalls 107 and the bottom surface 109 of the trench 103'. In an embodiment, the silicon liner layer 111 comprises amorphous silicon or polysilicon. A thickness of the silicon liner layer 111 is between about 10 Å to about 40 Å. The silicon liner layer 111 may be formed by using a furnace system in a gaseous environment containing $Si_2H_6$, $SiH_4$, $Si_3H_8$, $SiCl_2H_2$ or $SiCl_3H$. In one embodiment, the flow rates of $Si_2H_6$ should be in the range of about 10 standard cubic centimeters per minute (sccm) to about 1000 sccm. A temperature for the formation of the silicon liner layer 111 is in a rage of about 200° C. to about 600° C. A pressure range for the formation of the silicon liner layer 111 is from about 10 mTorr to about 10 Torr. Alternatively, the silicon liner layer 111 may be formed by using a deposition technique that can form a conformal silicon layer, such as the low temperature chemical deposition process in a gaseous environment containing $Si_3H_8$, $SiH_4$, $SiCl_2H_2$ or $SiCl_3H$. The gas environment also comprises a carrier gas such as $H_2$. The carrier gas helps to better control treatment uniformity. In one embodiment, the flow rates of $Si_3H_8$ and $H_2$ should be in the range of about 10 standard cubic centimeters per minute (sccm) to about 1000 sccm, and of about 5 standard liters per minute (slm) to about 50 slm, respectively. A temperature for the formation of the silicon liner layer 111 in the chemical deposition process is in a range of about 250° C. to 550° C.

Figure 4:
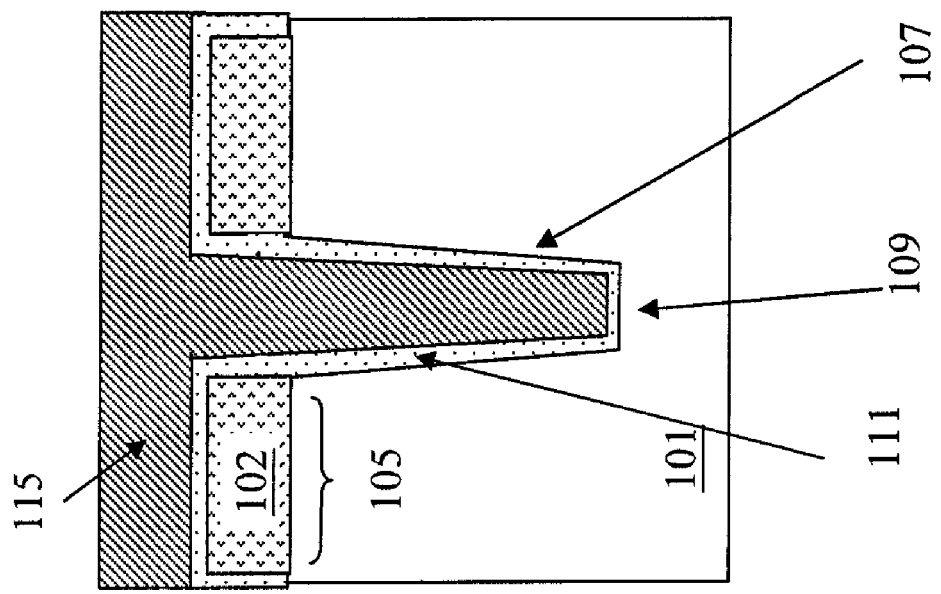

Referring to FIG. 4 and FIG. 7, in process step 230, a flowable dielectric material 115 overfills the trenches 103' and the masking layer 102 to form a shallow trench isolation (STI) structure. The flowable dielectric material 115 may comprise a flowable silicon oxide or silicon nitride dielectric material. The flowable dielectric material 115 is formed by using a spin on dielectric (SOD) such as a silicate, a siloxane, a methyl SilsesQuioxane (MSQ), a hydrogen SisesQuioxane (HSQ), an MSQ/HSQ, a perhydrosilazane (TCPS) or a per-hydro-polysilazane (PSZ). Alternatively, the flowable dielectric layer 115 can be formed by using a low temperature plasma chemical vapor deposition at a temperature less than about 100° C. under a pressure ranging from about 100 mTorr to about 10 Ton. A reaction source uses a gaseous environment containing $Si_3H_9N$ and $NH_3$. In one embodiment, the flow rates of $Si_3H_9N$ and $NH_3$ should be in the range of about 100 standard cubic centimeters per minute (sccm) to about 1000 sccm, and of about 100 sccm to about 2000 sccm, respectively. This particular dielectric film could be formed by an Alectrona® system, which is offered by Applied Materials of Santa Clara, Calif. The flowable dielectric material 115 is capable of filling the narrow and deep gaps and prevents voids and discontinuities in the STI structure.

Referring to FIG. 7, in process step 240, a curing process is performed on the flowable dielectric material 115 in the trench 103'. In one embodiment, the curing process is operated in a flow rate of $O_3$ in the range of about 100 standard cubic centimeters per minute (sccm) to about 5000 sccm. A temperature for the curing process is in a range of about 10° C. to about 500° C. A pressure range for the curing process is from about 1 Torr to about 760 Torr. It is believed that the curing of flowable dielectric material 115 enables the transformation of Si—O bond network to densify the dielectric material.

Figure 5:
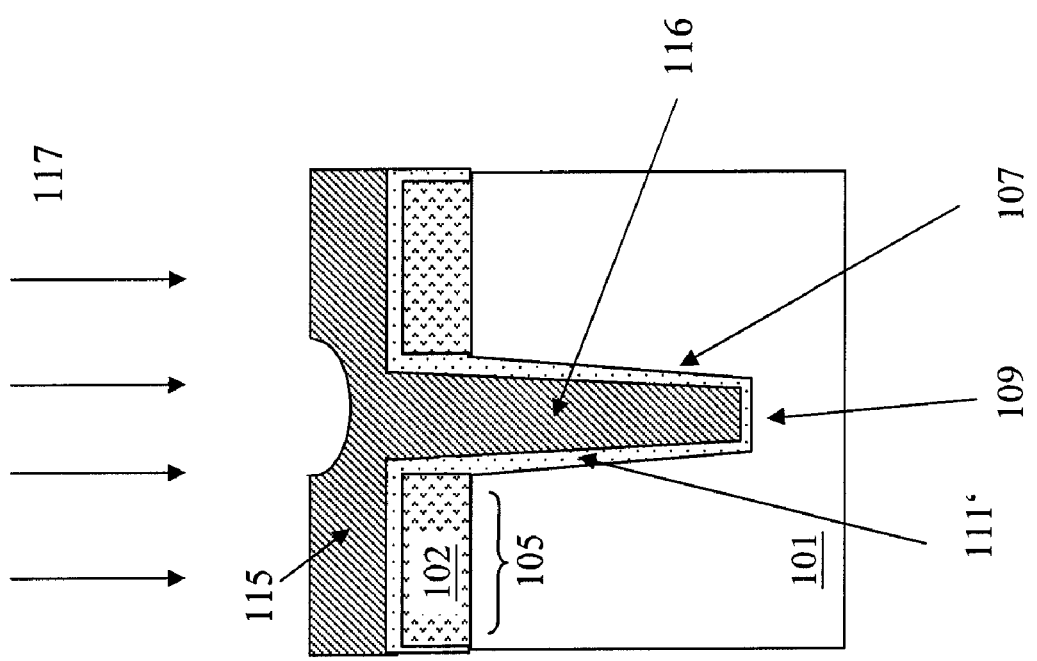

Referring to FIG. 5 and FIG. 7, in process step 250, an anneal process 117 is performed. The anneal process could further densify and improve the quality of the flowable dielectric material 115, and convert the silicon liner layer 111 into a silicon oxide layer 111' simultaneously. In one embodiment, the anneal process is performed in an environment containing steam in a flow rate of about 5 sccm to about 20 sccm. The anneal process is at a temperature in a range of about 1000° C. to about 1200° C. The anneal process starts at about 200° C. and ramps up the temperature gradually to a predetermined temperature of about 1000° C. to about 1200° C. The completed STI 116 performs better than an STI formed without using the silicon layer 111. During annealing the flowable dielectric 115 can shrink as it densifies. Without the silicon liner 111, the densification can form low density pockets within the STI 116, which would reduce the STI 116 etch resistance. With the silicon liner 111, the converted silicon oxide layer 111' expands into the trench during the anneal as the flowable dielectric 115 densifies into STI 116. This mechanism reduces shrinkage of the STI 116, avoids the formation of low density pockets, and improves adhesion between the silicon oxide 111' and STI 116 as compared to a process without the silicon liner 111. Overall, the etch resistance of the STI 116 is improved. Regardless of the mechanism, annealing the silicon liner layer 111 in the above described environments increases the breakdown voltage of the STI 116, enabling the STI 116 to provide improved isolation.

Figure 6:
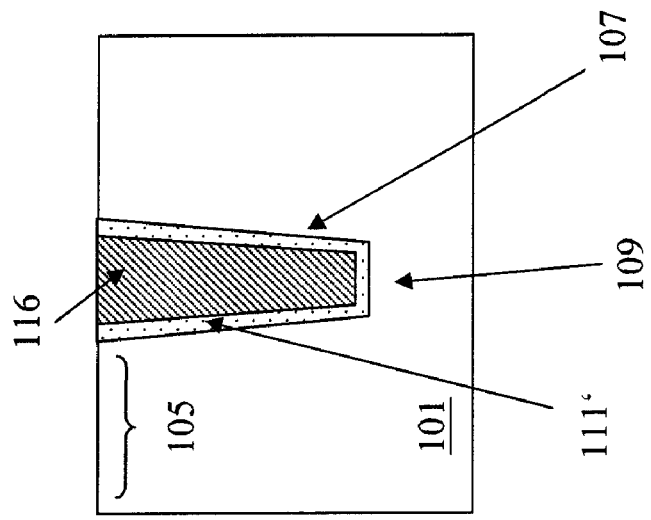
Figure 7:
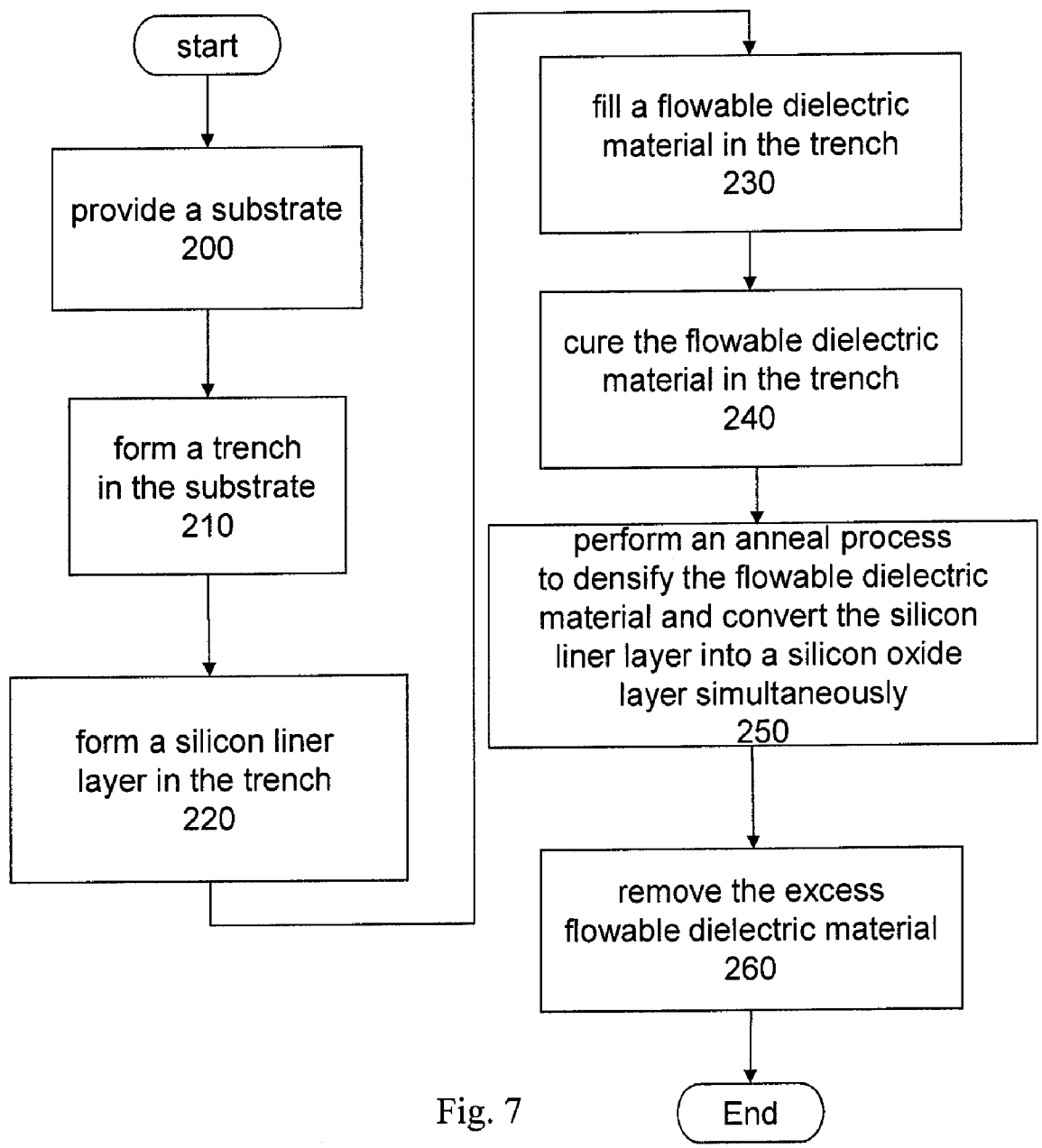
FIG. 7 is a flow chart of a method for fabricating a shallow trench isolation structure.

Referring to FIG. 6 and FIG. 7, in process step 260, the excess flowable dielectric material 115 outside of the trenches 103' and masking layer 102 is removed through a process such as chemical mechanical polishing (CMP), an etch, or a combination of these. The removal process preferably removes any flowable dielectric material 115 that is located over the masking layer 102 as well, so that the removal of the masking layer 102 will expose the active areas 105 to further process steps. FIG. 6 shows the completed STI 116 after the excess dielectric material 115 and masking layer 102 have been removed.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a shallow trench isolation structure, comprising:
   providing a substrate comprising a top surface;
   forming a trench extending from the top surface into the substrate, wherein the trench has sidewalls and a bottom surface;
   forming a silicon liner layer on the sidewalls and the bottom surface;
   filling a flowable dielectric material in the trench;
   curing the flowable dielectric material in a gaseous environment containing $O_3$; and
   performing an anneal process to densify the flowable dielectric material and convert the silicon liner layer into a silicon oxide layer simultaneously.

2. The method of claim 1, wherein the silicon liner layer is an amorphous silicon layer.

3. The method of claim 1, wherein the trench has:
   an aspect ratio in the range of about 5 to about 10; and
   a width not more than 42 nm.

4. The method of claim 1, wherein the silicon layer has a thickness in the range of about 10 Å to about 40 Å.

5. The method of claim 1, wherein the silicon liner layer is formed in a gaseous environment containing $Si_2H_6$, $Si_3H_8$, $SiH_4$, $SiCl_2H_2$, or $SiCl_3H$.

6. The method of claim 1, wherein the silicon liner layer is formed in a temperature range of about 200° C. to about 600° C.

7. The method of claim 1, wherein the flowable dielectric material is formed in a gaseous environment containing $Si_3H_9N$ and $NH_3$.

8. The method of claim 1, wherein curing the flowable dielectric material is carried out in an environment in a temperature range of about 10° C. to 500° C.

9. The method of claim 1, wherein the anneal process is performed in a temperature range of about 1000° C. to 1200° C.

10. A method of forming a shallow trench isolation structure, comprising:
    providing a substrate comprising a top surface;
    forming a trench extending from the top surface into the substrate, wherein the trench has sidewalls and a bottom surface;
    forming an amorphous silicon liner layer on the sidewalls and the bottom surface;

filling a flowable oxide material in trench;

curing the flowable oxide material in a gaseous environment containing $O_3$; and performing an anneal process to densify the flowable oxide material and convert the amorphous silicon liner layer into a silicon oxide layer simultaneously.

11. The method of claim 10, wherein the trench has:

an aspect ratio in the range of about 5 to about 10; and a width not more than 42 nm.

12. The method of claim 10, wherein the amorphous silicon layer has a thickness in the range of about 10 Å to about 40 Å.

13. The method of claim 10, wherein the amorphous silicon liner layer is formed in a gaseous environment containing $Si_2H_6$, $Si_3H_8$, $SiH_4$, $SiCl_2H_2$, or $SiCl_3H$.

14. The method of claim 10, wherein the silicon liner layer is formed in a temperature range from about 200° C. to about 600° C.

15. The method of claim 10, wherein the flowable oxide material is formed in a gaseous environment containing $Si_3H_9N$ and $NH_3$.

16. The method of claim 10, wherein the flowable oxide material is formed by a method comprising a spin on dielectric method or a low temperature deposition method.

17. The method of claim 16, wherein the low temperature deposition method is in a temperature less than about 100° C.

18. The method of claim 10, wherein curing the flowable dielectric material is in a temperature range of about 10° C. to 500° C. before the anneal process.

19. The method of claim 10, wherein the anneal process is performed in a temperature range of about 1000° C. to 1200° C.

20. The method of claim 19, wherein the anneal process is carried out in an environment containing steam.

* * * * *